United States Patent
Huntley et al.

(10) Patent No.: US 7,392,825 B2
(45) Date of Patent: Jul. 1, 2008

(54) ARRANGEMENT FOR TOOL EQUIPMENT

(75) Inventors: Graeme Huntley, Bridgwater (GB); Kate Wilson, Mountain View, CA (US)

(73) Assignee: Edwards Vaccum, Inc., Wilmington, MA (US)

( * ) Notice: Subject to any disclaimer, the term of this patent is extended or adjusted under 35 U.S.C. 154(b) by 557 days.

(21) Appl. No.: 11/182,531

(22) Filed: Jul. 15, 2005

(65) Prior Publication Data

US 2007/0012368 A1 Jan. 18, 2007

(51) Int. Cl.
*H01L 21/00* (2006.01)
*F04B 41/06* (2006.01)

(52) U.S. Cl. ............................. 137/565.29; 137/565.23; 29/25.01

(58) Field of Classification Search ............ 137/565.23, 137/565.29; 29/25.01, 729
See application file for complete search history.

(56) References Cited

U.S. PATENT DOCUMENTS

| 6,058,852 | A | 5/2000 | Estvanko |
| 6,251,759 | B1 * | 6/2001 | Guo et al. .................... 438/584 |
| 6,277,199 | B1 * | 8/2001 | Lei et al. ...................... 118/696 |
| 6,397,883 | B1 * | 6/2002 | Huntley et al. .......... 137/565.23 |
| 7,187,994 | B1 * | 3/2007 | Ashkenaz et al. ......... 414/217.1 |

FOREIGN PATENT DOCUMENTS

EP 1109204 A2 * 6/2001

* cited by examiner

*Primary Examiner*—John Rivell
(74) *Attorney, Agent, or Firm*—Ira Lee Zebrak; Mary K. Nicholes

(57) ABSTRACT

An arrangement comprising ancillary equipment mounted to a semiconductor processing tool and service center remote from the semiconductor processing tool minimizing the local space requirements and facilitates easy access for repair.

20 Claims, 7 Drawing Sheets

ARRANGEMENT FOR TOOL EQUIPMENT

BACKGROUND OF THE INVENTION

The present invention relates to an arrangement for mounting ancillary equipment that functions in connection with a semiconductor processing tool. The equipment sections lack facilities and contain only the basic equipment mechanism and are mounted onto the semiconductor tool. More particularly, the present invention relates to such an arrangement in which a plurality of such equipment sections housing the ancillary equipment are connected to a service section which provides the facilities for operation of the equipment. This arrangement allows for easy access to the equipment sections for repair or servicing.

The present invention also provides an arrangement in which ancillary equipment sections are mounted directly onto the semiconductor tool framework and connected to a service section which is at a location remote from the equipment section. In this manner, easy access to repair or service any ancillary equipment is facilitated while minimizing the requirements for space on the tool for equipment providing that function.

A semiconductor processing facility is often constructed on two levels. The tools used in fabricating the semiconductors will then be situated on a main level while ancillary equipment may be located on a level beneath the main level known as a sub-fab. Each piece of ancillary equipment situated within the sub-fab will ideally be beneath the tool it services. For instance, many tools incorporate a vacuum chamber. A vacuum pump associated with a particular chamber will then be located beneath such chamber on the sub-fab level.

While the placement of the equipment relative to the tools would appear to use the shortest runs of piping, in practice, however, excessive networks of piping result which can reduce efficiency or increase losses and make the layout and servicing of the equipment very difficult. Installation of the equipment is also problematic in that the equipment must not only be assembled within the fabrication facility, but also be tested within such facility. If any piece of equipment proves to be faulty, it and possibly other surrounding equipment must be removed and replaced. A still further problem is that often such tools utilize noxious, dangerous chemicals that are drawn off by, for instance, vacuum pumps for disposal by a variety of types of abatement systems.

Accordingly, there is a need for an arrangement design which minimizes space requirements and facilitates removal and repair of equipment used in conjunction with semiconductor tools.

SUMMARY OF THE INVENTION

The present invention provides an arrangement for mounting ancillary equipment to support a semiconductor processing tool. The arrangement includes a plurality of equipment sections lacking facilities and a service section. The ancillary equipment is mounted directly onto the semiconductor processing tool while the service section is at a location remote from the equipment sections. The service section which contains facility sources and is connected to the equipment sections provides facilities for operation of the equipment therein.

In this manner, the space necessary for accommodating the equipment sections is minimized, yet each equipment section can easily be accessed for repair and servicing. This provides point of use service, e.g., pumping, thereby minimizing losses and maximizing efficiency.

BRIEF DESCRIPTION OF THE DRAWINGS

While the specification concludes with claims distinctly pointing out the subject matter that Applicants regard as their invention, it is believed that the invention will be better understood when taken in connection with the accompanying drawings in which:

DETAILED DESCRIPTION

Figure 1:
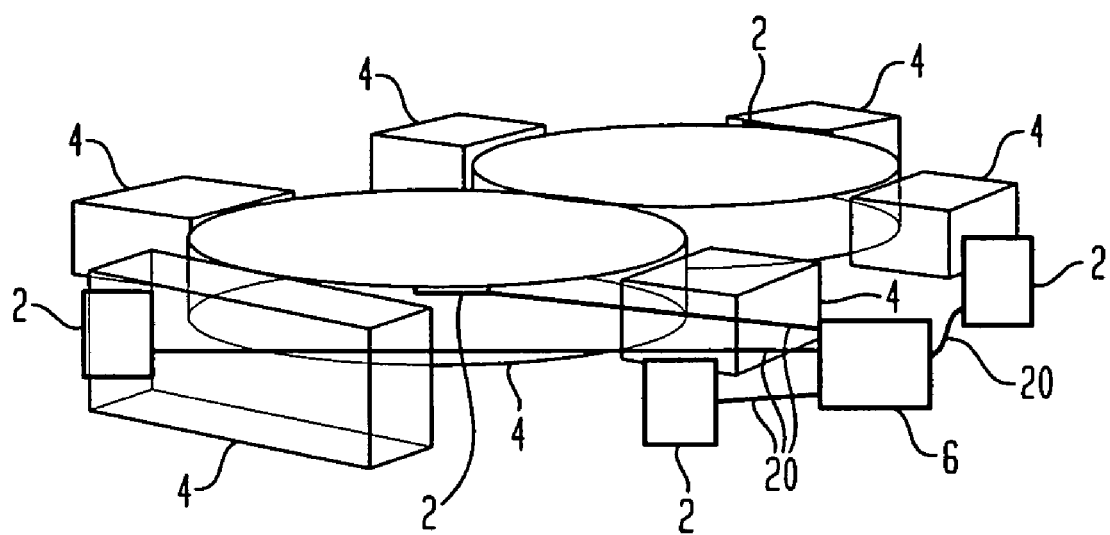
FIG. 1 is a schematic view of an arrangement in which equipment sections are directly mounted to a semiconductor tool in accordance with the invention.

With reference to FIG. 1, an arrangement in accordance with the present invention is illustrated in which equipment sections 2 lacking facilities are directly mounted onto a semiconductor processing tool framework 4. A service section 6 includes facility sources for operation of the equipment sections 2.

Figure 2:
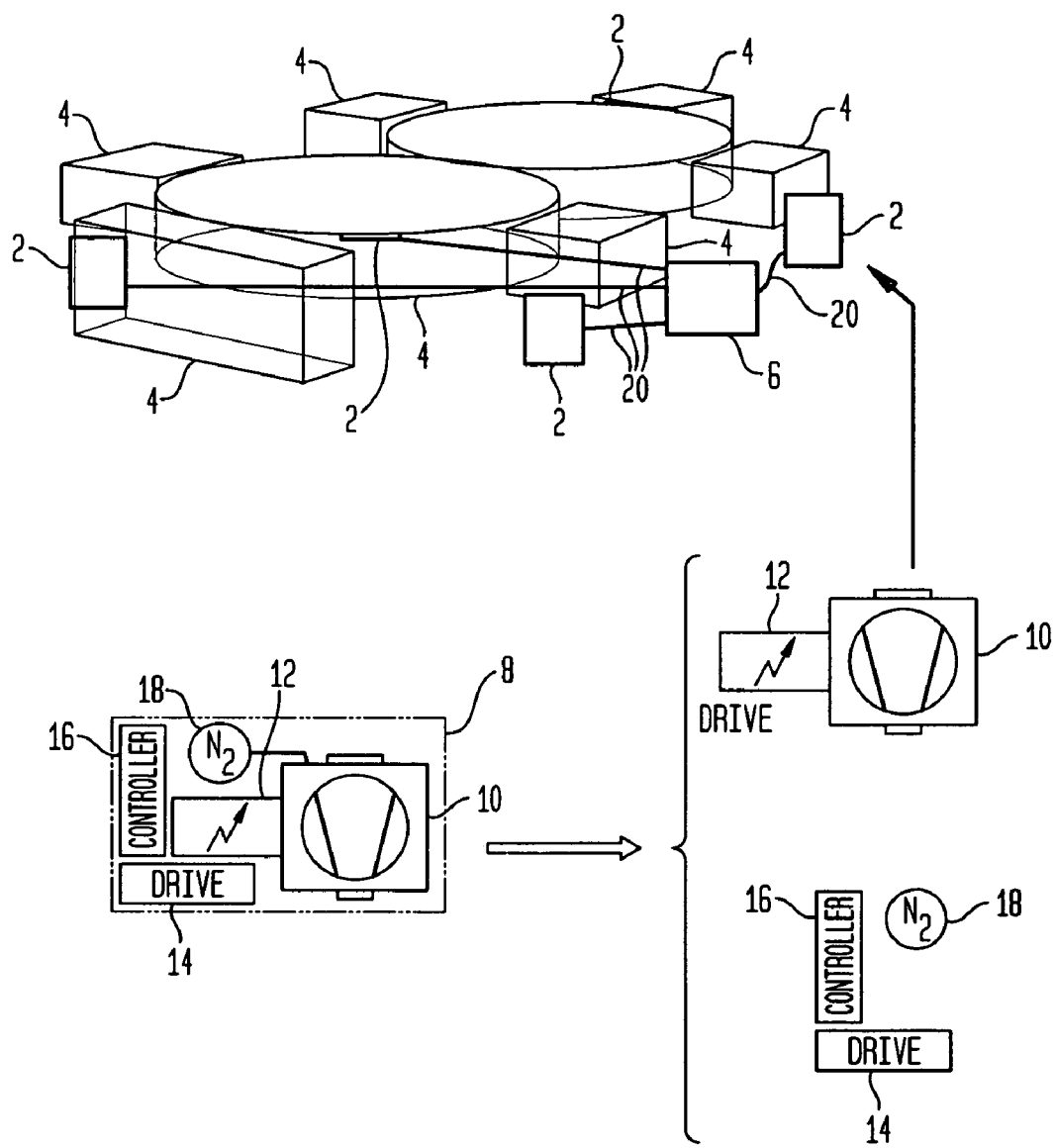
FIG. 2 is a schematic view of an arrangement in which a pump is directly mounted to a semiconductor tool in accordance with the invention.

Equipment components for semiconductor tools are well known to those skilled in the art and include but are not limited to pumps power supplies, valves and the like. The equipment components which are mounted on the tool include only the basic mechanism. For example, as shown in FIG. 2, a pump 8 typically includes several components including a pump mechanism 10, a motor 12, a drive 14, a controller 16 and nitrogen module 18. In an embodiment of the present invention schematically illustrated in FIG. 2, the basic pumping cartridge of the pump 10 and the motor 12 without controller 16 or other facilities is mounted onto the tool, such that it can be easily extracted for repair or service and minimizes the amount of space that it occupies on the tool. The controller 16, drive 14 and nitrogen module 18 are centrally mounted in service section 6. In this manner the basic pumping cartridge 10 and motor 12 can be easily extracted for repair or service without having to first dismantle the other pump components such as the controller 16, drive 14 and nitrogen module 18. This arrangement facilitates easy access to the components which need repair and minimizes downtime for the semiconductor processing tool.

Figure 3:
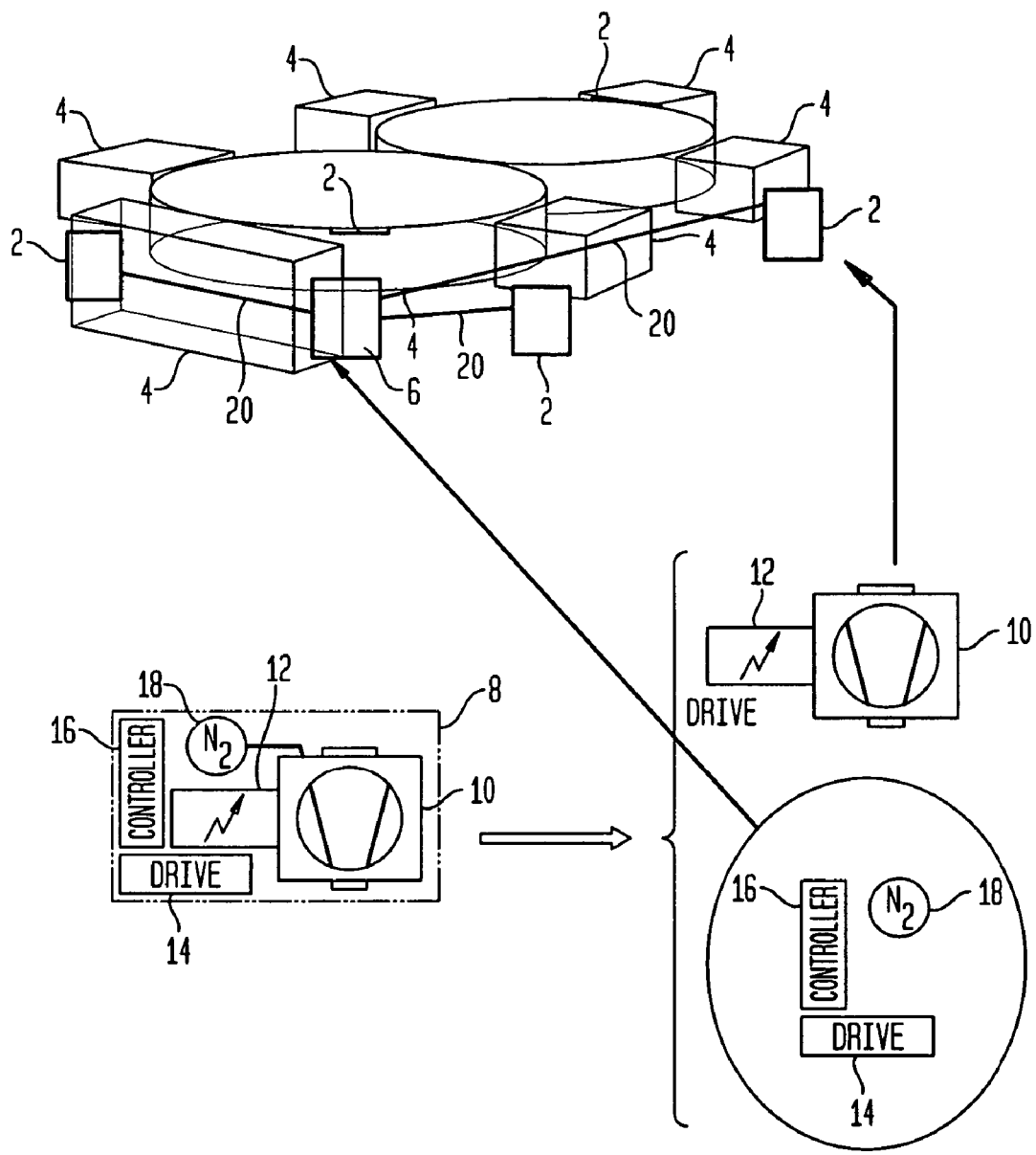
FIG. 3 is schematic view of an arrangement in which the service section is directly mounted to the semiconductor tool in accordance with the invention.
Figure 4:
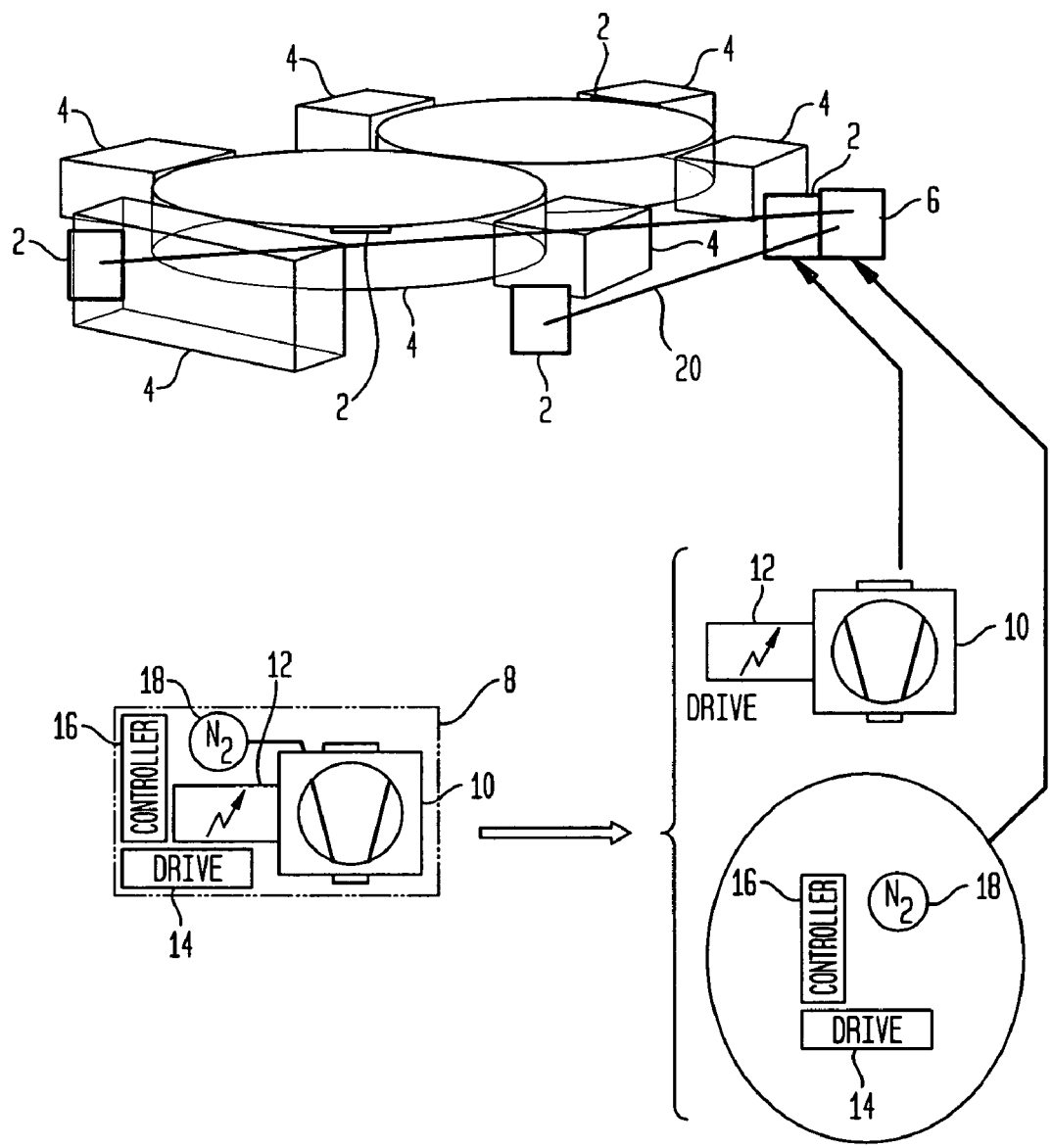
FIG. 4 is a schematic view of an arrangement in which the service section includes a pump in accordance with the invention.

In an alternate embodiment shown in FIG. 3 the service section 6 can be mounted onto the semiconductor processing tool 4 and/or may include at least one of, but not all, of the ancillary equipment. For example, as illustrated in FIG. 4, the service section 6 may include a pump which may serve as the primary connection point for the facilities and may also be the hub to distribute the facilities to other ancillary equipment.

Figure 5:
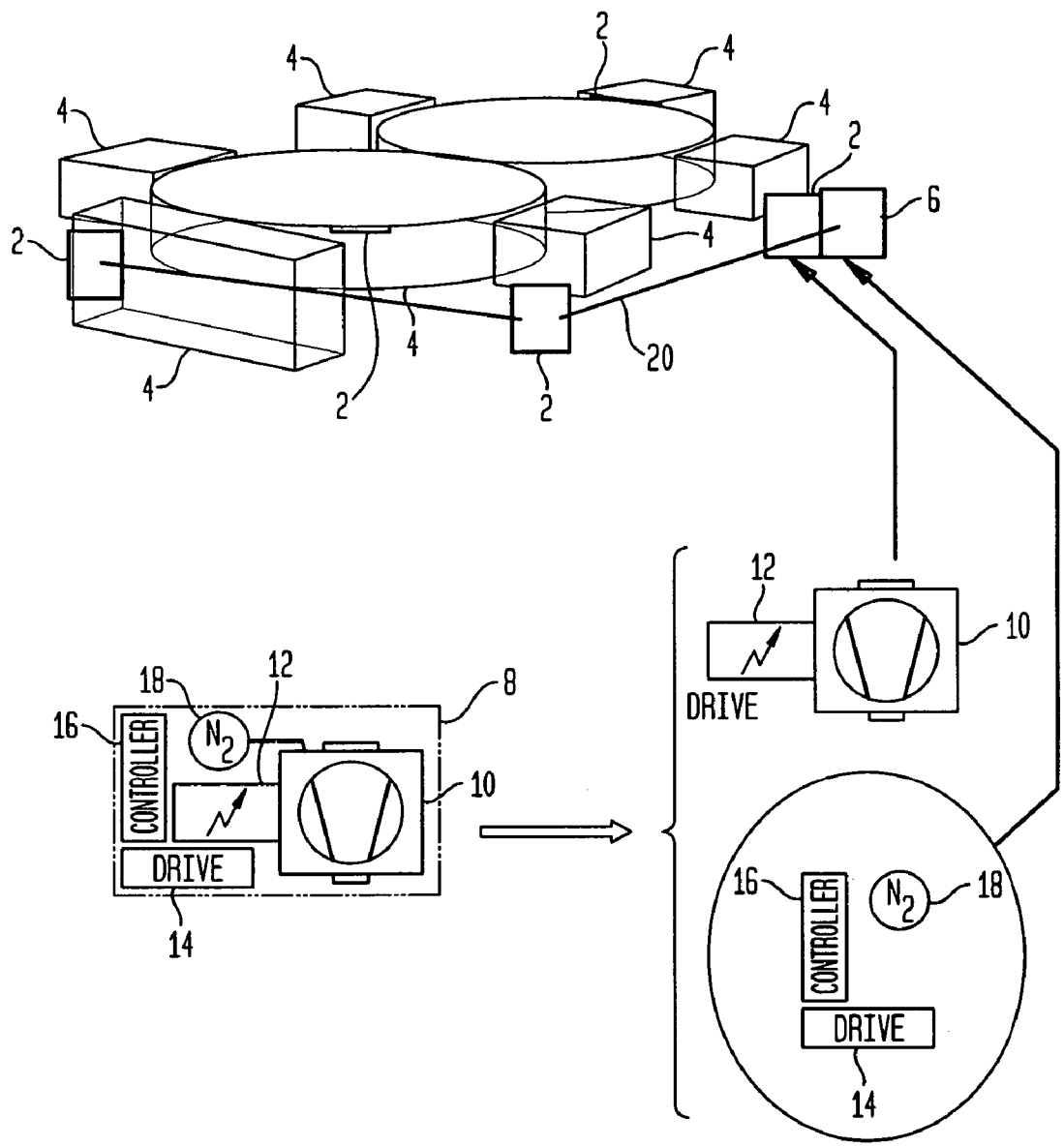
FIG. 5 is a schematic view of an arrangement in which a single carrier distributes facilities from the service section to all the equipment sections in accordance with the invention.

In a further embodiment shown in FIG. 5 rather than a hub arrangement shown in FIG. 1, a single carrier 20 distributes facilities from service section 6 to all the equipment sections 2.

As will be understood by one skilled in the art, the mounting of the equipment component or service section onto the tool will be such that the equipment or service section is received in area which does not interfere with the function of tool or damage the tool in any manner, yet the location is such that the component can be easily extracted for repair or service. For example, the equipment component 2 and service section 6 can be attached to process tool 4 by flange mounting, bracket mounting, gluing or any other suitable means.

The equipment component may be mounted on rectangular section supports that are configured to receive the tangs of a forklift vehicle and allow forklift removal as described in U.S. Pat. No. 6,058,852 which is incorporated by reference herein.

Figure 6A:
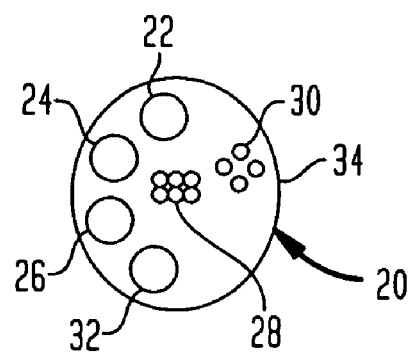
FIG. 6(a) an 6(b) are a cross-sectional illustration of a carrier, and a perspective view of a carrier including bundled facility conduits, respectively, in accordance with the invention.
Figure 6B:
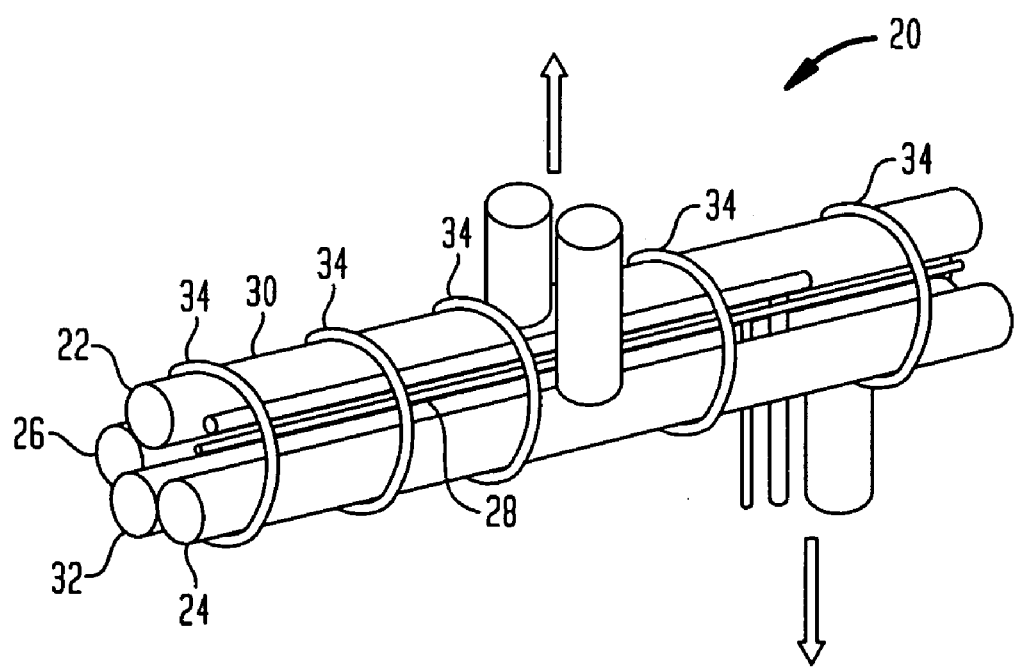
Figure 7A:
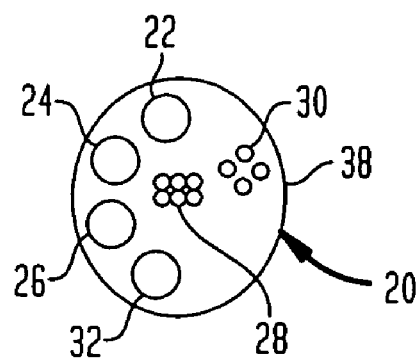
FIG. 7 is a perspective view of a carrier including a housing in accordance with the invention.
Figure 7B:
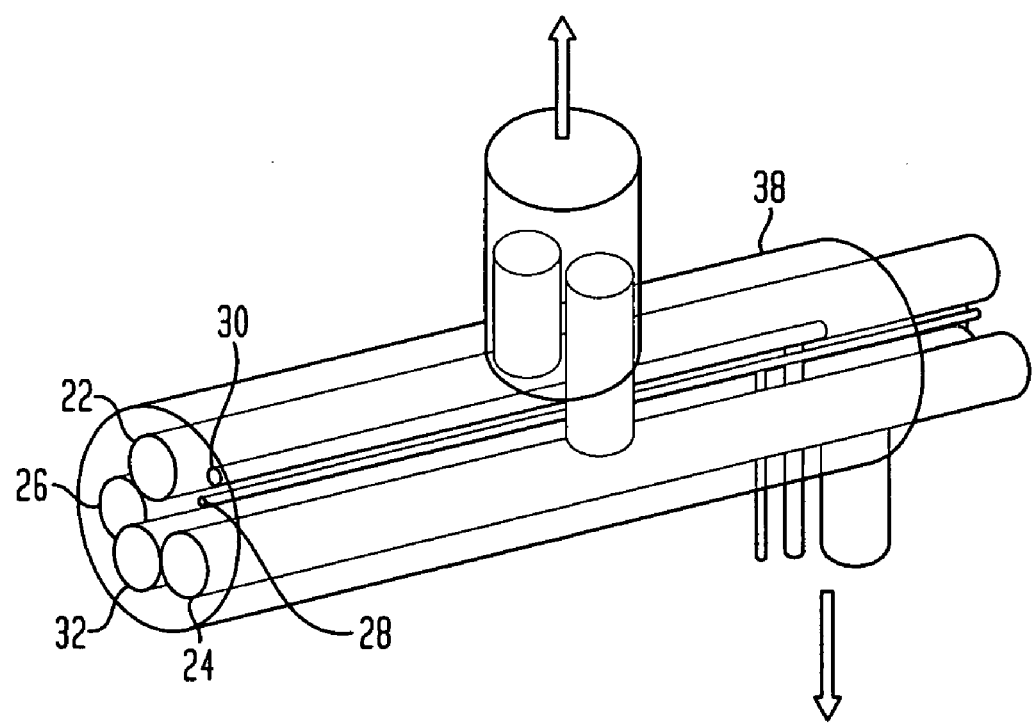

Facilities for the equipment component 2 are provided from service section 6 through carrier 20 as shown in FIG. 1. Carrier 20 may be a single conduit carrying each facility or may include a collection of individual facilities bundled together. An illustration of a carrier in cross section for a pump is shown in FIG. 6(a). Facilities for a pump, for example, may include cooling water feed 22, cooling water return 24, nitrogen source 26, control connection 28, power 30 and clean dry air 32 to drive valves. The pump facilities may be bundled together by a tie wrap 34 as shown in FIG. 6(b). In an alternate embodiment shown in FIG. 7, the facilities are enclosed in a central housing 38. A preferred pump is the EPX pump available from BOC Edwards, N.J.

Although preferred embodiments are specifically illustrated and described herein above, it will be appreciated that many modifications and variations of the present invention are possible in light of the above teachings and within the purview of the appended claims without departing from the spirit and intended scope of the invention.

We claim:

1. An arrangement for mounting ancillary equipment to support a semiconductor processing tool, said arrangement comprising;
   a plurality of ancillary equipment sections, each of said ancillary equipment sections lacking facilities and mounted directly onto the semiconductor processing tool; and
   a service section at a location separate from at least one of the ancillary equipment sections, the service section including facility sources for at least one of the equipment sections,
   wherein the plurality of equipment sections and the service section are connected to one another.

2. An arrangement for mounting ancillary equipment to support a semiconductor processing tool according to claim 1 wherein the plurality of equipment sections and the service section are connected to one another by at least one carrier extending between the ancillary equipment and the service section.

3. An arrangement for mounting ancillary equipment to support a semiconductor processing tool according to claim 2 wherein the carrier includes at least one facility conduit for the ancillary equipment.

4. An arrangement for mounting ancillary equipment to support a semiconductor processing tool according to claim 3 wherein the carrier includes at least one conduit for a facility source selected from the group consisting of nitrogen, power, controller, driver, cooling water feed, cooling water return and clean dry air.

5. An arrangement for mounting ancillary equipment to support a semiconductor processing tool according to claim 1 wherein the ancillary equipment comprises at least one pump.

6. An arrangement for mounting ancillary equipment to support a semiconductor processing tool according to claim 4 wherein the ancillary equipment comprises at least one pump.

7. An arrangement for mounting ancillary equipment to support a semiconductor processing tool according to claim 3 wherein the carrier includes a plurality of facility conduits which are bundled together.

8. An arrangement for mounting ancillary equipment to support a semiconductor processing tool according to claim 3 wherein the carrier includes a plurality of facility conduits which are located in a housing.

9. An arrangement according to claim 4 including at least two facilities wherein the facility conduits are bundled together in the carrier.

10. An arrangement according to claim 4 wherein the carrier includes a housing.

11. An arrangement for mounting ancillary equipment to support a semiconductor processing tool according to claim 1 wherein the service section is mounted directly onto the semiconductor processing tool.

12. An arrangement for mounting ancillary equipment to support a semiconductor processing tool according to claim 1 wherein the service section includes at least one of the ancillary equipment but less than all of the ancillary equipment.

13. An arrangement for mounting ancillary equipment to support a semiconductor processing tool according to claim 1 wherein the service section includes a pump.

14. An arrangement according to claim 2, comprising one carrier extending between the ancillary equipment and the service section.

15. An arrangement according to claim 1 wherein at least one equipment section includes a pump mechanism and a motor, and the service section includes at least one facility source selected from the group consisting of a controller, driver and nitrogen module.

16. An arrangement according to claim 15 wherein the service section is mounted onto the semiconductor tool.

17. An arrangement according to claim 2 wherein at least one equipment section includes a pump mechanism and a motor and the service section includes at least one facility source selected from the group consisting of a controller, driver and nitrogen module.

18. An arrangement according to claim 2 wherein the service section is mounted onto the semiconductor tool.

19. An arrangement according to claim 17 wherein the carrier includes a housing.

20. An arrangement according to claim 18 wherein the carrier includes a housing.

* * * * *